United States Patent
Lin

(10) Patent No.: US 6,254,423 B1
(45) Date of Patent: Jul. 3, 2001

(54) POWER DIODE TERMINAL HOLDER MOUNTING ARRANGEMENT

(76) Inventor: Chin-Feng Lin, 3F., No. 2, Lane 8, Fu Yuan Street, Hsintien, Taipei Hsien (TW)

(*) Notice: Subject to any disclaimer, the term of this patent is extended or adjusted under 35 U.S.C. 154(b) by 0 days.

(21) Appl. No.: 09/753,554

(22) Filed: Jan. 4, 2001

(51) Int. Cl.[7] ............................................ H05K 7/20
(52) U.S. Cl. ..................... 439/487; 174/16.3; 361/711
(58) Field of Search ........................ 439/83, 485, 487, 439/876; 361/709, 711, 717, 718, 806–809; 29/832, 840; 174/16.3

(56) References Cited

U.S. PATENT DOCUMENTS 5,602,720 * 2/1997 Natsuhara et al. ................... 439/487
6,021,045 * 2/2000 Johnson ............................... 361/717
B1 4,521,827 * 4/1988 Jordan et al. .......................... 29/840

FOREIGN PATENT DOCUMENTS 54-139558-A * 10/1979 (JP).
62-013106-A * 1/1987 (JP).

* cited by examiner

*Primary Examiner*—Renee Luebke
*Assistant Examiner*—Felix D. Figueroa
(74) *Attorney, Agent, or Firm*—Dougherty & Troxell

(57) ABSTRACT

A power diode terminal holder mounting arrangement includes a copper plate connected between two chips on a heat sink above a ceramic plate, and a terminal holder soldered to the copper plate, the copper plate having a circular hole through a flat base thereof; the terminal holder having a conical bottom end fitted into the circular hole of the copper plate and disposed in contact with a top sidewall of the ceramic plate.

1 Claim, 5 Drawing Sheets

POWER DIODE TERMINAL HOLDER MOUNTING ARRANGEMENT

BACKGROUND OF THE INVENTION

The present invention relates to power diodes and, more specifically, to a power diode terminal holder mounting arrangement, which is easy to install.

FIG. 1 shows a power diode terminal holder mounting arrangement according to the prior art design, two chips 2' are respectively soldered to a heat sink 1', the chips 2' each having two molybdenum pads 4' respectively soldered thereto at the top and bottom sides, and a copper plate 3' is soldered to the top-sided molybdenum pads 4' of the chips 2' to hold a terminal holder 5'. The copper plate 3' has a recessed top sidewall. This design is not suitable for a high power diode. FIG. 2 shows another power diode terminal holder mounting arrangement, in which the copper plate 3" has a flat top sidewall fitting the flat bottom edge of the terminal holder 5'. Because the flat top sidewall of the copper plate 3" is a solid face, gas cannot be exhausted from the center of the soldering area between the copper plate 3" and the terminal holder 5', and air bubbles may exist in between the copper plate 3" and the terminal holder 5' after the soldering procedure. In this case, the terminal holder tends to be forced away from the copper plate 3", and the performance of the terminal holder 5' in heat and electricity conductivity is poor.

SUMMARY OF THE INVENTION

The present invention has been accomplished to provide a power diode terminal holder mounting arrangement, which eliminates the aforesaid drawbacks. It is one object of the present invention to provide a copper plate for a power diode terminal holder mounting arrangement, which fits any of a variety of terminal holders. It is another object of the present invention to provide a power diode terminal holder mounting arrangement, which holds the terminal holder positively in position during the soldering procedure. According to the present invention, a ceramic plate is soldered to the chips and suspended below the bottom sidewall of the copper plate, and the copper plate has a flat base and a circular hole through the flat base for receiving any of a variety of terminal holders. After insertion of the selected terminal holder into the circular hole of the copper plate, the ceramic plate supports the terminal holder in position, and then the ceramic plate is soldered to the periphery of the circular hole of the copper plate.

DETAILED DESCRIPTION OF THE PREFERRED EMBODIMENT

Figure 1:
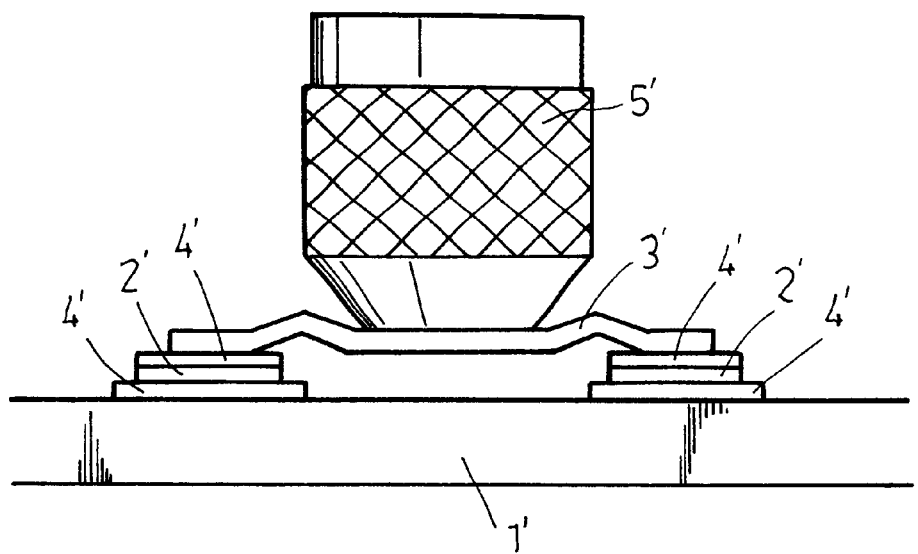
FIG. 1 illustrates a power diode terminal holder mounting arrangement according to the prior art.
Figure 2:
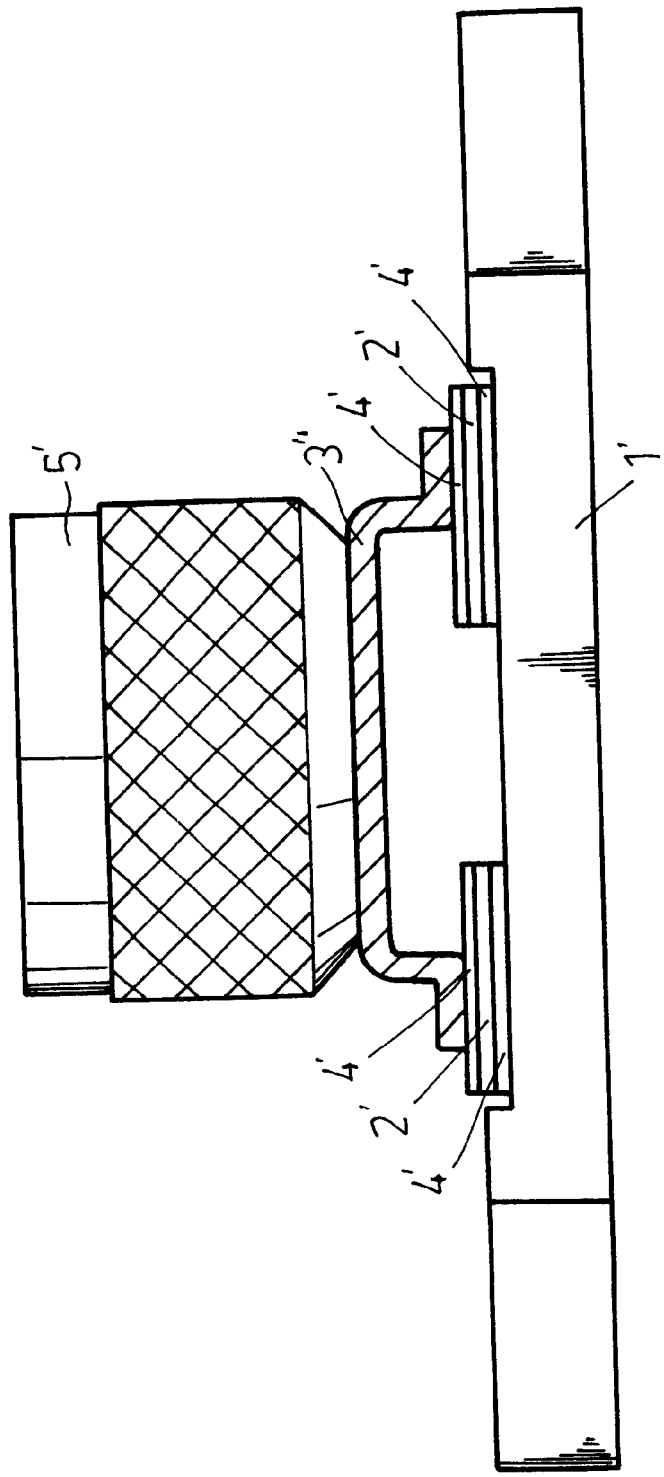
FIG. 2 illustrates another design of power diode terminal holder mounting arrangement according to the prior art.
Figure 3:
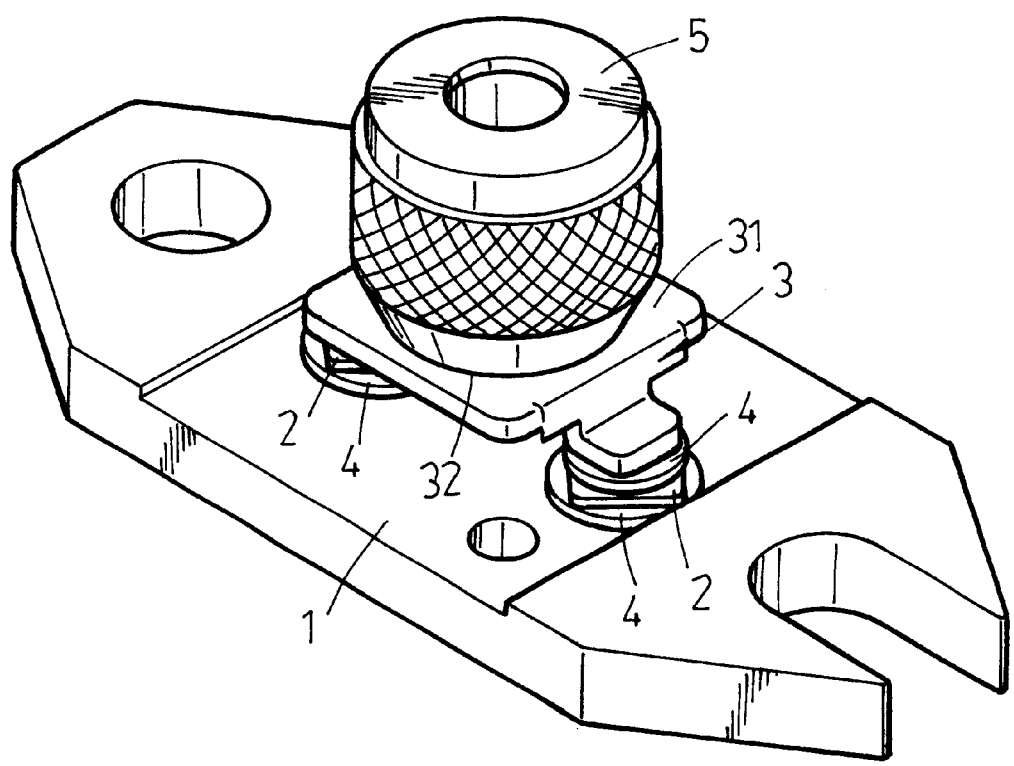
FIG. 3 is an elevational view of the present invention.
Figure 4:
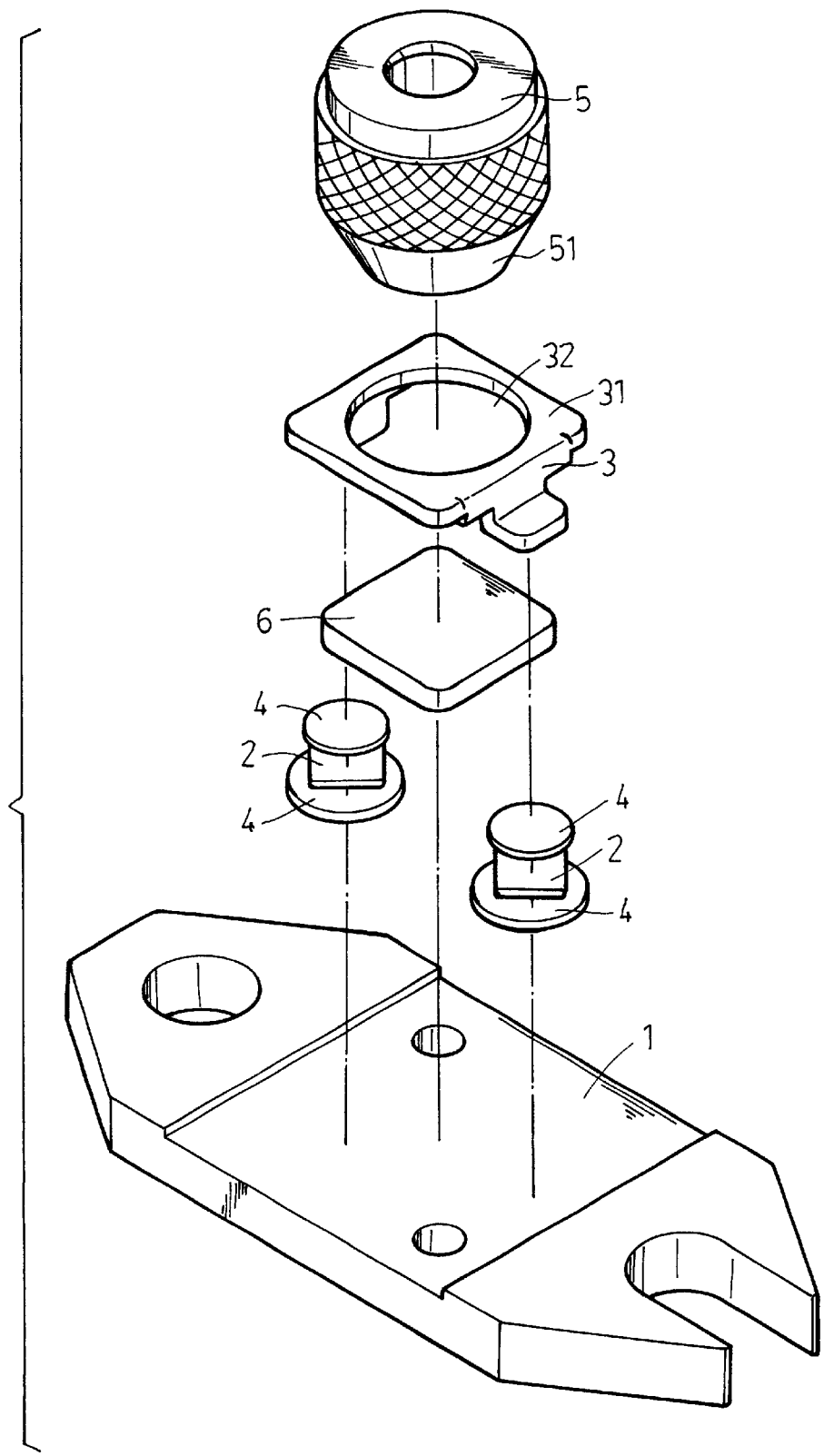
FIG. 4 is an exploded view of the present invention.
Figure 5:
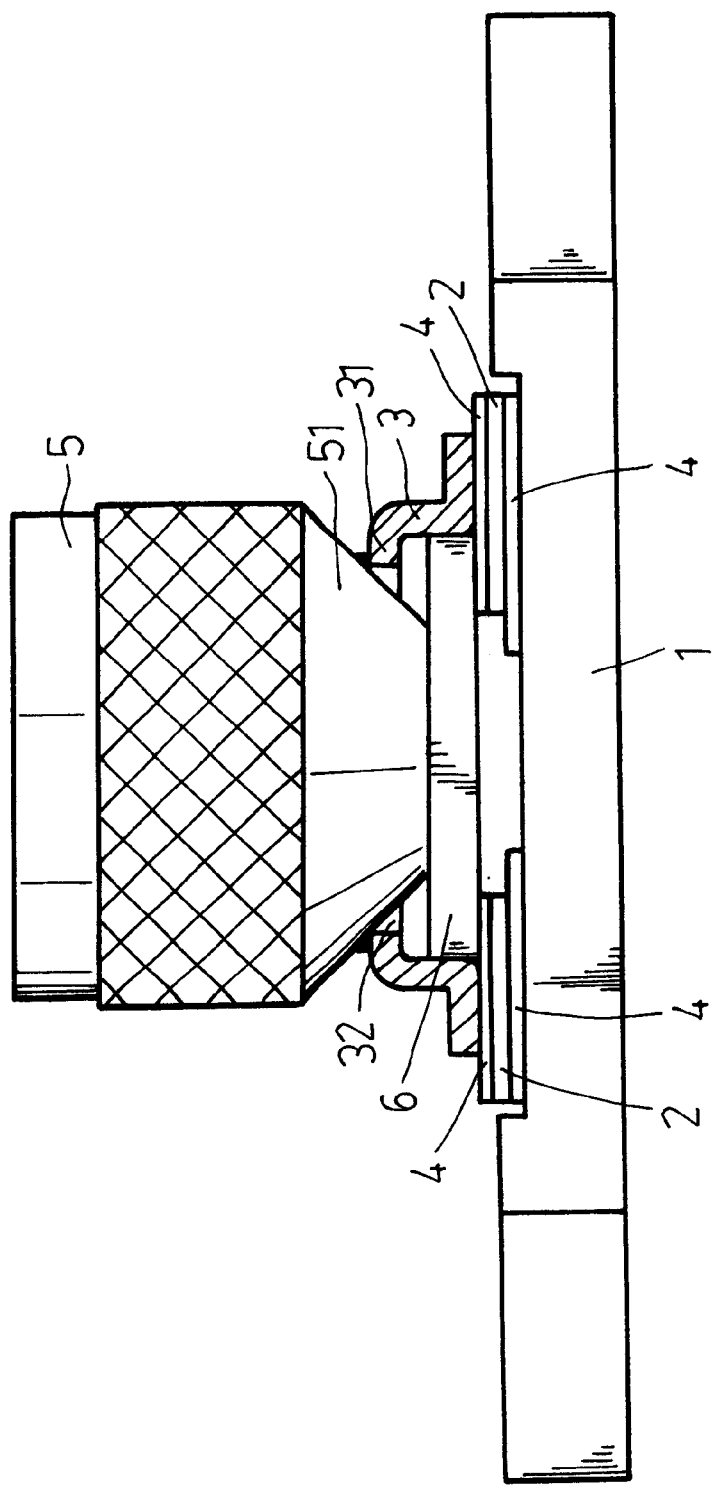
FIG. 5 is a side view in section in an enlarged scale of the present invention.

Referring to FIGS. from 3 through 5, two chips 2 are soldered to a heat sink 1. Each chip 2 has two molybdenum pads 4 respectively soldered to top and bottom sides thereof. A copper plate 3 is connected between the chips 2 at the topside and soldered to the top-sided molybdenum pads 4 of the chips 2. A terminal holder 5 is soldered to the copper plate 3 at the topside. A ceramic plate 6 is soldered to the top-sided molybdenum pads 4 of the chips 2 and spaced below the bottom sidewall of the copper plate 3. The copper plate 3 comprises a flat base 31 and a circular hole 32 through the flat base 31. The terminal holder 5 comprises a conical bottom end 51 fitted into the circular hole 32 of the copper plate 3, and disposed in close contact with the ceramic plate 6.

The conical bottom end 51 of the terminal holder 5 is shaped like a truncated cone, which when inserted into the circular hole 32, is kept in close contact with the top sidewall of the ceramic plate 6. After inserted into the circular hole 32, the terminal holder 5 is soldered to the periphery of the circular hole 32 of the copper plate 3 by spot soldering. Because the flat bottom side of the conical bottom end 51 of the terminal holder 5 is supported on the ceramic plate 6 and the peripheral wall of the conical bottom end 51 fits the circular hole 32 of the copper plate 3, the terminal holder 5 is firmly supported in position during the soldering procedure.

It is to be understood that the drawings are designed for purposes of illustration only, and are not intended for use as a definition of the limits and scope of the invention disclosed.

What the invention claimed is:

1. A power diode terminal holder mounting arrangement comprising a copper plate above a ceramic plate connected between two chips on a heat sink, and a terminal holder soldered to said copper plate, wherein said copper plate comprises a circular hole through a flat base thereof; said terminal holder comprises a conical bottom end fitted into the circular hole of said copper plate and disposed in contact with a top sidewall of said ceramic plate.

* * * * *